United States Patent [19]
Sik

[11] Patent Number: 5,989,039
[45] Date of Patent: Nov. 23, 1999

[54] SOCKET APPARATUS FOR TESTING PACKAGE

[75] Inventor: Lim Yu Sik, Daeku, Rep. of Korea

[73] Assignee: LG Semicon Co., Ltd., Choongcheongbuk-Do, Rep. of Korea

[21] Appl. No.: 09/070,781

[22] Filed: May 1, 1998

[30] Foreign Application Priority Data

Jun. 25, 1997 [KR] Rep. of Korea ............... 97-15606

[51] Int. Cl.⁶ ...................................................... H01R 9/09
[52] U.S. Cl. ............................................. 439/73; 439/331
[58] Field of Search ........................... 439/73, 331, 330

[56] References Cited

U.S. PATENT DOCUMENTS

| | | | |
|---|---|---|---|
| 5,161,984 | 11/1992 | Taylor et al. | 439/73 |
| 5,290,193 | 3/1994 | Goff et al. | 439/73 |
| 5,460,538 | 10/1995 | Ikeya | 439/73 |
| 5,545,050 | 8/1996 | Sato et al. | 439/73 |
| 5,626,481 | 5/1997 | Abe | 439/73 |
| 5,646,447 | 7/1997 | Ramsey et al. | 257/727 |
| 5,807,104 | 9/1998 | Ikeya et al. | 439/73 |
| 5,823,794 | 10/1998 | Abe | 439/73 |

*Primary Examiner*—Khiem Nguyen
*Assistant Examiner*—T C Patel
*Attorney, Agent, or Firm*—Morgan, Lewis & Bockius LLP

[57] ABSTRACT

A socket apparatus for testing a semiconductor package includes a main body having a plurality of contact pins therein, a locking member disposed in the main body for securing the semiconductor package that is to be loaded into the main body, an unlocking member for releasing the package secured by the locking member, and a cover disposed above the locking member and the unlocking member. The socket apparatus improves a contactability between the external terminals of the package and the contact pins during the package testing and decreases production cost due to its simplified composition.

16 Claims, 6 Drawing Sheets

SOCKET APPARATUS FOR TESTING PACKAGE

BACKGROUND OF THE INVENTION

1. Field of the Invention

The present invention relates to a package testing socket, and more particularly, to an improved socket apparatus for testing a semiconductor chip package, which is capable of preventing a contact error from occurring by downwardly supporting a mounted package.

2. Description of the Background Art

In recent years, a multi-functioning trend of electronic appliances causes a semiconductor package to be smaller in size and larger in pin number. Studies have been made in a way in which a socket development for such a multi-pin package inspection is directed to a further accuracy in a less time period.

U.S. Pat. No. 5,646,447 discloses a socket for inspecting a ball grid array (BGA) chip package as a multi-pin package. As disclosed in U.S. Pat. No. 5,646,447, a slidable plate having a plurality of through holes to insert solder balls therethrough is slidably disposed on the upper surface of a base, and a cam shaft movably engaged to a cam shaft handle serves to operate the slidable plate. The through holes formed in the slidable plate thrusts respective upper portions of contact pins in order for the contact pins to be attached onto the solder balls of the package when the slidable plate is slid by the cam shaft.

However, the above-described package inspection socket is complicated in composition, thereby increasing production cost thereof, and although the socket strengthens a contactability between the solder balls and the contact pins of the package being normally mounted in the socket, an accurate inspection has been understood difficult when the package is mounted in the socket in an unstable state.

SUMMARY OF THE INVENTION

The present invention is directed to solve the conventional disadvantages. Accordingly, an object of the present invention is to provide a socket apparatus for testing a semiconductor package.

Another object of the present invention is to provide a socket apparatus for testing a semiconductor package which is capable of essentially preventing the package from being deviated therefrom by downwardly suppressing the package during the package testing.

Still another object of the present invention is to provide a socket apparatus for testing a semiconductor package which decreases production cost by simplifying the composition thereof.

To achieve the above-described objects, there is provided a socket apparatus for testing a semiconductor package according to the present invention which includes a main body having a plurality of contact pins therein, a locking member disposed in the main body for securing the semiconductor package that is to be loaded into the main body, an unlocking member for releasing the package secured by the locking member, and a cover disposed above the locking member and the unlocking member.

These and other objects and advantages of the present invention will become more readily apparent from the detailed description given hereinafter. However, it should be understood that the detailed description and specific example, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

As illustrated in FIGS. 1 through 5, the socket apparatus for testing a semiconductor package according to the preferred embodiments of the present invention includes a main body 10 having a plurality of contact pins 2 which transmit therethrough electrical signals of a semiconductor chip package that is to be mounted therein, a locking member 20 (see FIG. 2) movably disposed in the main body 10 for securing the package that is to be mounted therein, an unlocking member 30 (see FIGS. 3 and 4) for releasing the package secured by the locking member 20, a cover 40 (see FIGS. 1 and 2) for operating the locking member 20 and the unlocking member 30, and an elastic support member 50 (see FIGS. 1 and 2) for elastically supporting between the main body 10 and the cover 40.

Figure 1:
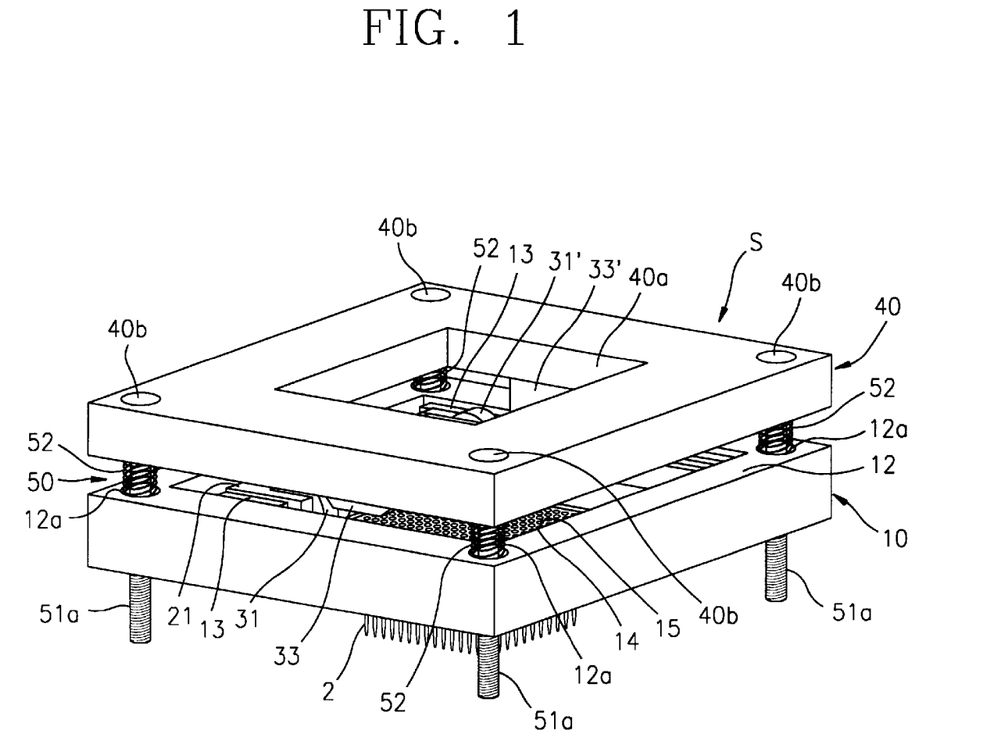
FIG. 1 is a perspective view illustrating a socket apparatus for testing a semiconductor package according to the preferred embodiments of the present invention.
Figure 2:
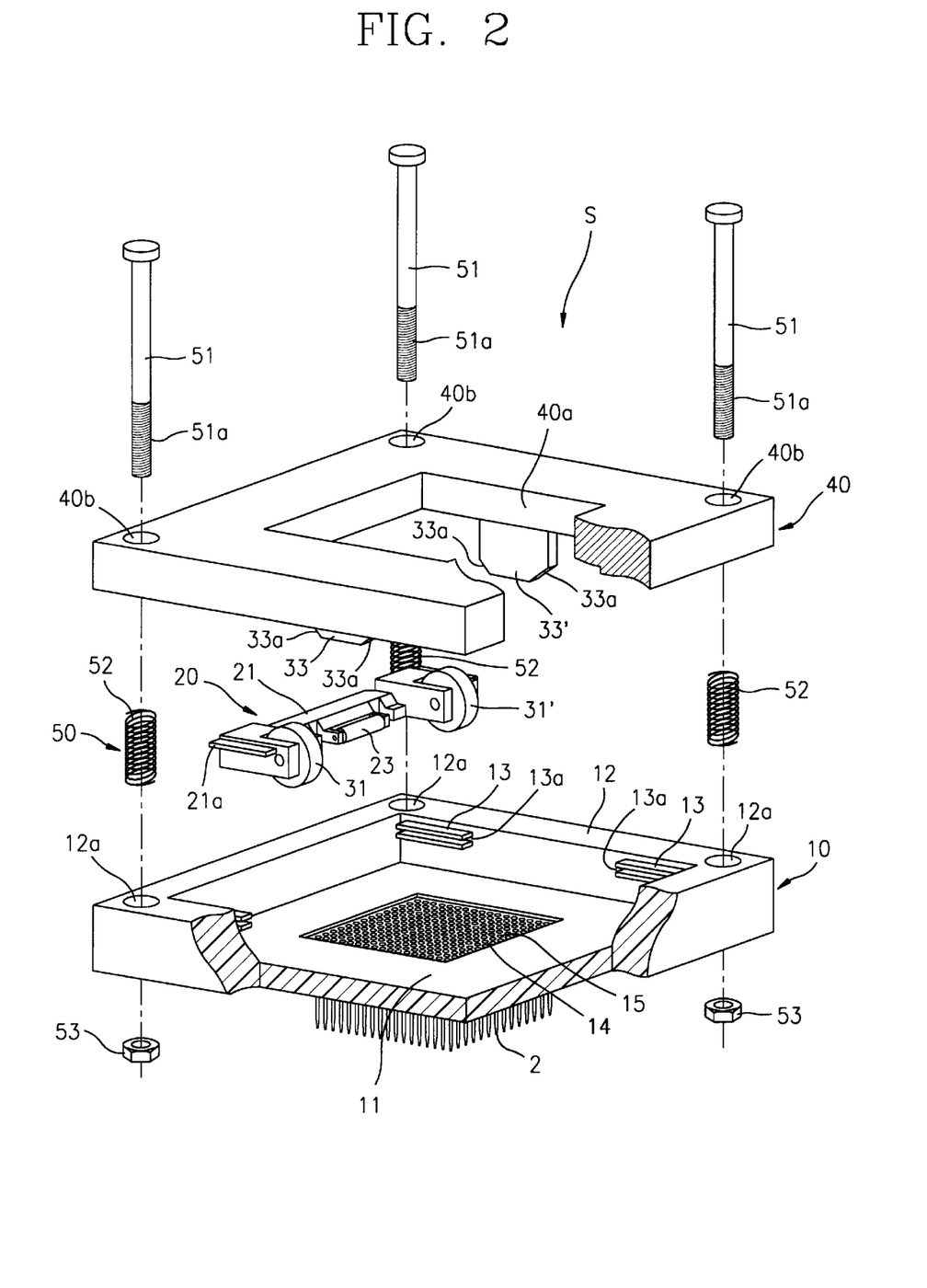
FIG. 2 is an exploded perspective view illustrating the socket apparatus for testing a semiconductor package according to the present invention.

As shown in FIG. 2, the main body 10 includes a body frame 11 which is a square shaped plate made of insulation material. A body wall 12 is upwardly extended from the marginal edge of the body frame 11. A spring hole 12a and a guide hole 12b are formed in vertical consecutiveness at each corner of the body wall 12. A guide pair 13 having a sliding recess 13a therebetween are disposed on corresponding portions of inner periphery of the body wall 12. Through a package mounting portion 14 formed in the center of the body frame 11 there are formed a plurality of insertion holes 15 disposed on corresponding ones of upper tips of the plurality of contact pins 2 to facilitate the insertion of the external terminals of a package to be tested.

Figure 3:
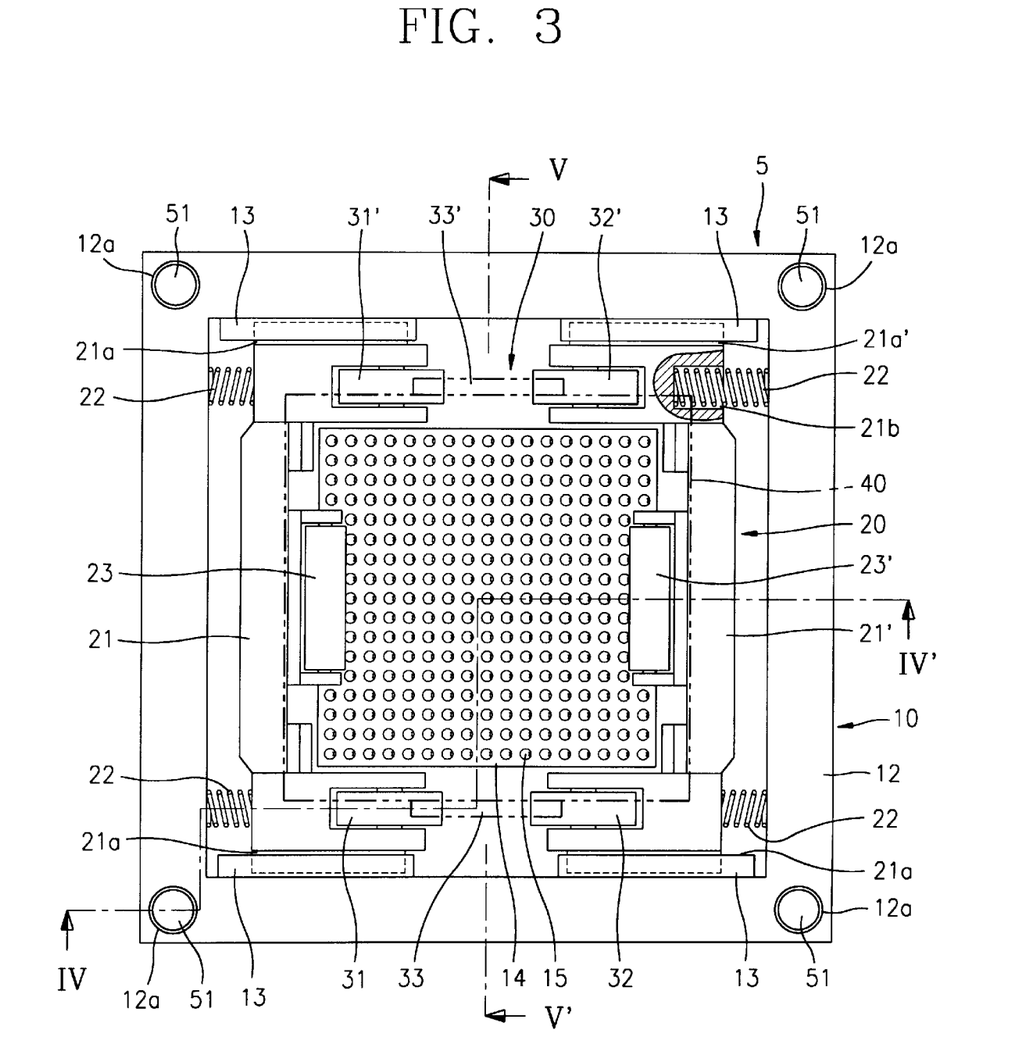
FIG. 3 is a plan view of the socket apparatus in FIG. 1.

As shown in FIGS. 2 and 3, the locking member 20 includes left side and right side plate shaped sliders 21, 21' on corresponding sides of the package receiving portion 14 formed in the center of the body frame 11 of the main body 10. On each rear side of the sliders 21, 21' there is provided a compression spring 22 so that the sliders 21, 21' can be elastically supported against the inner periphery of the body wall 12. At the front of each of the sliders 21, 21', support rollers 23, 23' are rotatably disposed in pin engagement at a predetermined height.

Sliding plates 21a, 21a' formed on respective end portions of the sliders 21, 21' are slidably inserted into the corresponding ones of the sliding recesses 13a formed between the guide pairs 13.

The compression springs 22 are fixedly inserted into corresponding fixing recesses 21b formed in rear side portions of the sliders 21, 21'.

Figure 4:
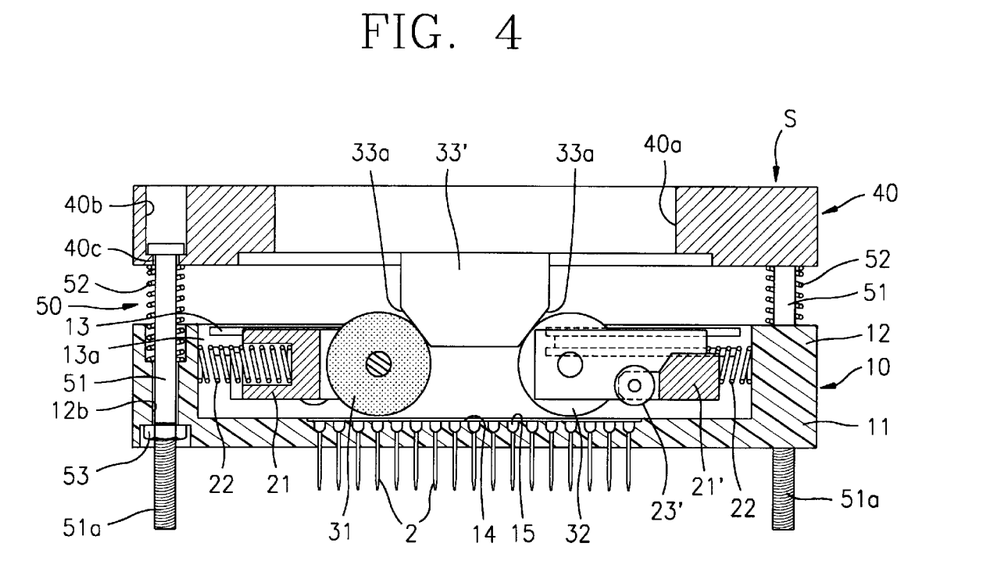
FIG. 4 is a cross-sectional view taken along line IV–IV' in FIG. 3.
Figure 5:
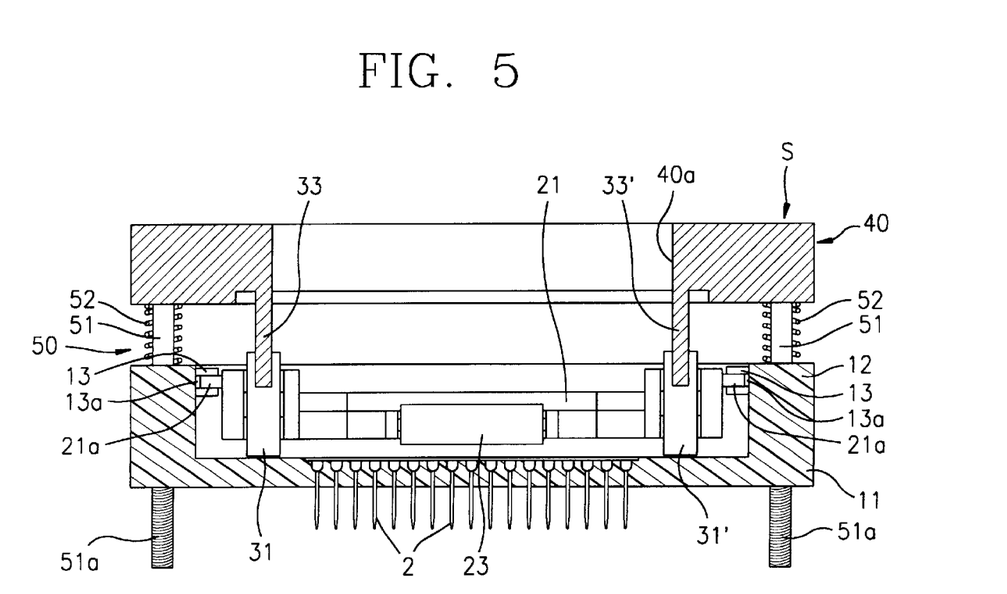
FIG. 5 is a cross-sectional view taken along line V–V' in FIG. 3.

As shown in FIGS. 2–4, the unlocking member 30 includes a pair of left side cam rollers 31, 31', and a pair of right side cam rollers 32, 32' which are rotatably engaged by pin into corresponding side portions of the sliders 21, 21', wherein the respective pairs of the cam rollers 31, 31' and 32, 32' are provided to face against each other. Cam plates 33, 33' downwardly extending from the lower surface of the cover 40 are disposed between each pair of the cam rollers 31, 31' and 32, 32' (see FIG. 4).

The cam plates 33, 33' include guide slopes 33a upwardly slanted from the lower ends thereof.

As shown in FIG. 2, through the center of the cover 40, there is formed a square shaped package passage opening 40a for passing a target package therethrough into the package mounting portion 14 formed in the center of the body frame 10. A guide hole 40b and a guide hole 40c are formed in sequential consecutiveness at each corner portion of the cover 40.

As shown in FIG. 2, in the elastic support member 50, a guide pin 51 having a threaded portion at its lower end is sequentially inserted into the guide hole 40b and the guide hole 40c which are downwardly formed at each corner of the cover 40, and into the spring hole 12a and the guide hole 12b which are downwardly formed at each corner of the main body 10. The elastic support springs 52 are correspondingly disposed between the cover 40 and the main body 10 and receive the guide pins 51 therethrough. A fixing nut 53 is screwed onto the threaded portion of each of the guide pins 51 to prevent the deviation of the cover 40.

That is, the cover 40 disposed on the upper surface of the main body 10 is elastically supported by the elastic support springs 52, while being guided by the guide pin 51 to move upwardly and downwardly.

Reference numerals 3, 4 and S respectively denote terminals, of a semiconductor package to be tested external terminal, a flange of the semiconductor package to be tested, and a socket apparatus.

The inspecting operation of the above-described socket apparatus for testing a semiconductor package according to the present invention will now be described.

Figure 6:
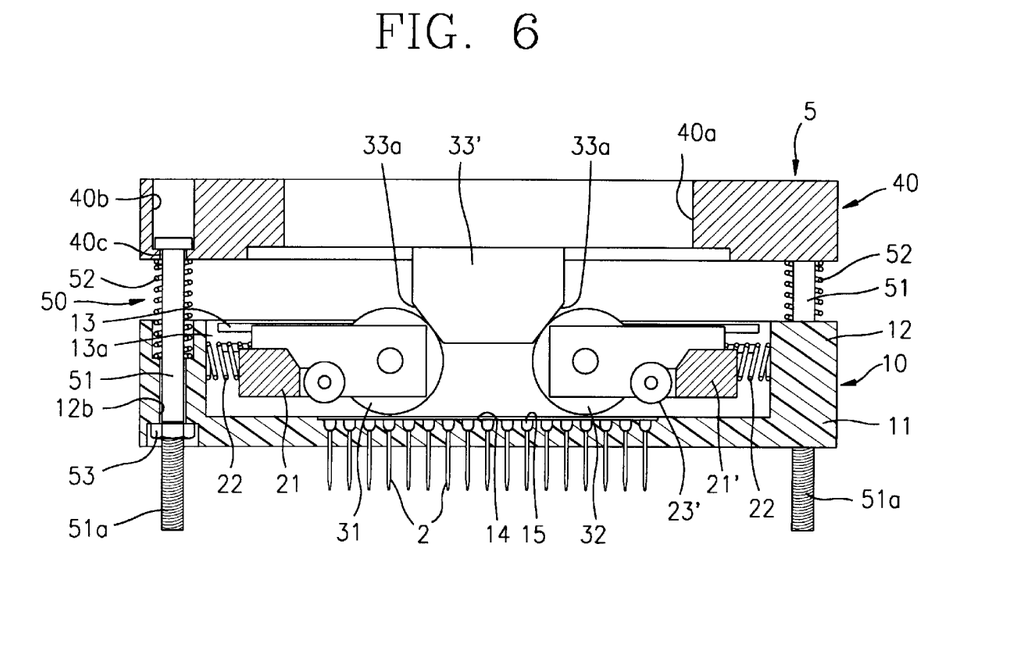
FIG. 6 is a cross-sectional view illustrating an inspection operation in a free state of the socket apparatus for testing a semiconductor package according to the present invention.

FIG. 6 is a cross-sectional view illustrating an inspection operation in a free state of the socket apparatus for testing a semiconductor package according to the present invention. As shown therein, the sliders 21, 21' of the locking member 20 are advanced to its front direction by the compression springs 22. Accordingly, the support rollers 23, 23' rotatably engaged by pin into the corresponding front portions of the sliders 21, 21' together with the left side cam rollers 31, 31' and the right side cam rollers 32, 32' which are also rotatably engaged by pin into each front side of the sliders 21, 21' are advanced to their front direction as well. As a result, the distance between the left side cam rollers 31, 31' and the right side cam rollers 32, 32' which are facing against each other becomes narrowed by a predetermined distance. The cam plates 33, 33' disposed above and between the left side cam rollers 31, 31' and the right side cam rollers 32, 32' are extended from the lower surface of the cover 40 which is to be raised by the elastic support springs 52, so that the cam plates 33, 33' are raised up to a predetermined height.

Figure 7:
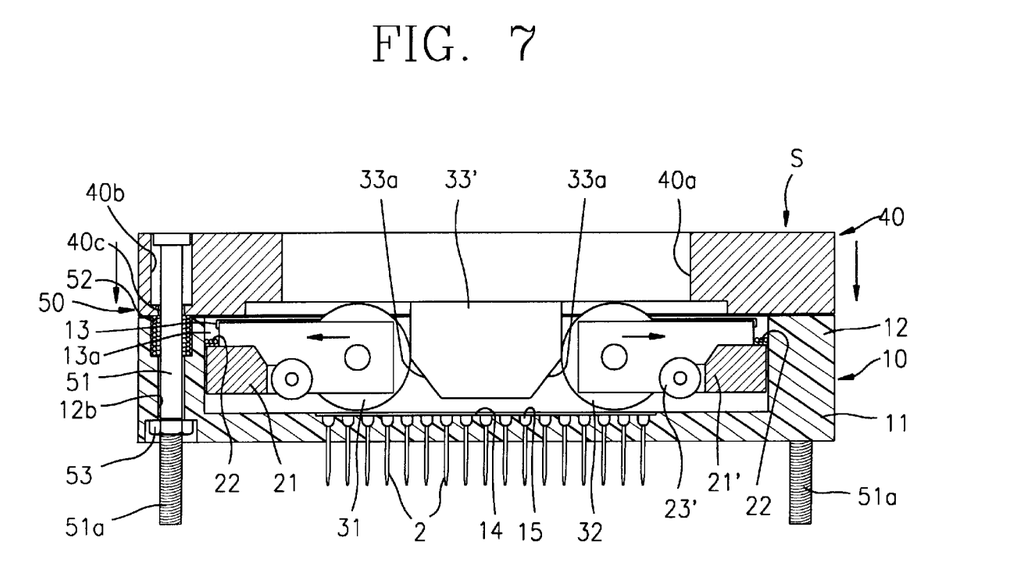
FIG. 7 is a cross-sectional view illustrating an inspection operation in an open state of the socket apparatus for testing a semiconductor package according to the present invention.

FIG. 7 is a cross-sectional view illustrating an inspection operation in an open state of the socket apparatus for testing a semiconductor package according to the present invention. As shown therein, an operator downwardly presses the cover 40 in order to load a target package into the socket S. When the cover 40 is pressed, the cam plates 33, 33' of the cover 40 are downwardly moved, accordingly. The downwardly moving cam plates 33, 33' are correspondingly inserted between the left side cam rollers 31, 31' and the right side cam rollers 32, 32'. At this time, the outer periphery of the left side cam rollers 31, 31' and the right side cam rollers 32, 32' becomes in contact with the guide slopes 33a, 33a', and then the left side rollers 31, 31' and the right side rollers 32, 32' become pushed backwardly. Therefore, the left and right side sliders 21, 21' having the left side cam rollers 31,31' and the right side cam rollers 32, 32' engaged by pin thereto are backwardly guided by the guides 13 against the force of the compression springs 22. Accordingly, the support rollers 23, 23' disposed at front portions of the sliders 21, 21' are backwardly pushed, thereby opening the package mounting portion 14 formed in the main body 10.

Figure 8:
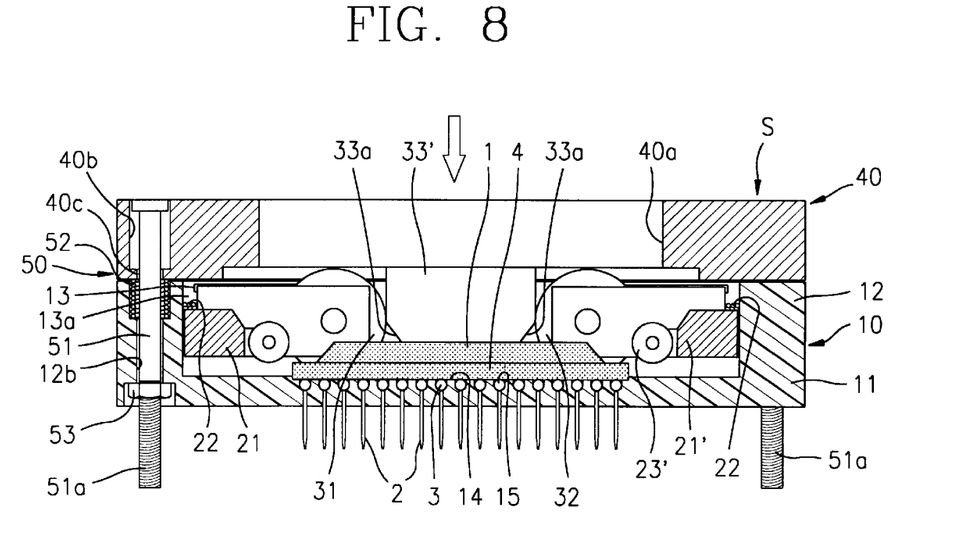
FIG. 8 is a cross-sectional view illustrating an inspection operation in a mounted state of the socket apparatus for testing a semiconductor package according to the present invention.

FIG. 8 is a cross-sectional view illustrating an inspection operation in a mounted state of the socket apparatus for testing a semiconductor package according to the present invention. As shown therein, the cover 40 is pressed and at the same time the target package 1 is moved into the package mounting portion 14 through the package passage opening 40a, so that the external terminals 3 of the package 1 are correspondingly inserted into the insertion holes 15 formed in the package mounting portion 14 while being in touch with the upper ends of the contact pins 2.

Figure 9:
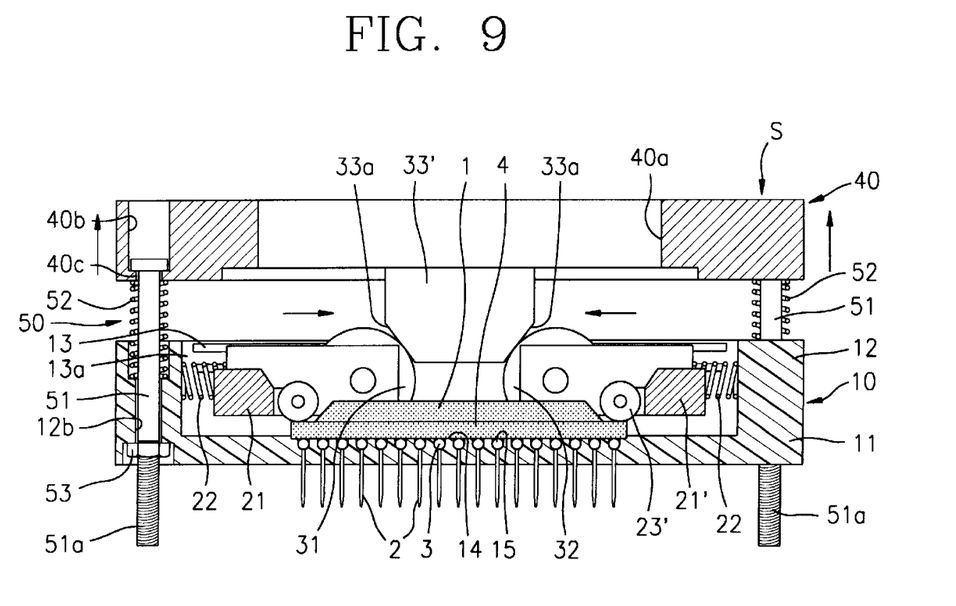
FIG. 9 is a cross-sectional view illustrating an inspection operation in a locked state of the socket apparatus for testing a semiconductor package according to the present invention.

FIG. 9 is a cross-sectional view illustrating an inspection operation in a locked state of the socket apparatus for testing a semiconductor package according to the present invention. As shown therein, when the force applied to the cover 40 is eliminated, the sliders 21, 21' are forwardly moved in accordance with the pushing force of the compression springs 22. Consequently, the support rollers 23, 23' disposed by a predetermined height at the front portion of the thusly advanced sliders 21, 21' serve to downwardly press the upper surface of the flanges 4 of the package 1 mounted in the package mounting portion 14, whereby the electrical attribute test for the package 1 is executed.

After a predetermined time of the package test at the above state, the cover 40 is again downwardly pressed to backwardly move the support rollers 23, 23'. At the same time the package 1 is unloaded through the package passage opening 40a formed through the center of the cover 40, thereby completing the electrical attribute test of the package 1.

The semiconductor package testing socket apparatus according to the present invention enables the testing of BGA (ball grid array) package, PGA (pin grid array) package, and DIP (dual in line) package and the like.

As described above, the socket apparatus for testing a semiconductor package according to the present invention prevents a package from being deviated during the package inspection by downwardly pressing the package being loaded with the provision of the locking member for downwardly pressing the package in the main body having a package mounting portion.

Further, the socket apparatus according to the present invention improves a contactability between the external terminals of the package and the contact pins.

Still further, the simplified composition of the socket apparatus according to the present invention decreased production cost and sufficiently prevents its breakdown.

As the present invention may be embodied in several forms without departing from the spirit of essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within meets and bounds of the claims, or equivalences of such meets and bounds are therefore intended to embrace the appended claims.

What is claimed is:

1. A socket apparatus for testing a semiconductor package, comprising:
    a main body having a plurality of contact pins therein for contacting terminals of the semiconductor package;
    locking means disposed in the main body for securing the semiconductor package within the main body, wherein the locking means includes a pair of support rollers capable of pressing the semiconductor package against the main body;
    unlocking means for releasing the semiconductor package secured by the locking means; and
    a cover disposed above the main body for engaging the locking means and the unlocking means.

2. The socket apparatus of claim 1, wherein the main body includes a body frame and a body wall the body wall extending to a predetermined height from a peripheral edge of the body frame.

3. The socket apparatus of claim 1, wherein the main body includes at least a pair of guide rails having a sliding recess therebetween disposed on an inner surface of the main body.

4. The socket apparatus of claim 1, wherein the locking means further comprises:
    left side and right side sliders disposed at a left inner surface and a right inner surface of the main body, respectively to face against each other;
    a compression spring disposed between the left side slider and the left inner surface and the right side slider and the right inner surface to elastically support the left side slider and the right side slider against the left and right inner surfaces of the main body; and
    wherein each of the pair of support rollers is rotatably disposed with a pin engagement at a front portion of the left side and right side sliders.

5. The socket apparatus of claim 4, wherein the locking means further comprises a sliding plate extended from an end portion of the left side and right side sliders to be slidably engaged with a sliding recess formed on an inner surface of the main body.

6. The socket apparatus of claim 1, wherein the unlocking means comprises:
    a pair of left side cam rollers rotatably engaged with a front portion of the left side slider, and a pair of right side cam rollers rotatably engaged with a front portion of the right side slider; and
    a pair of cam plates downwardly extending from a lower surface of the cover, capable of being inserted between the pairs of left and right side cam rollers.

7. The socket apparatus of claim 6, wherein the pair of cam plates each includes guide slopes upwardly slanted from a bottom portion thereof by a predetermined angle.

8. The socket apparatus of claim 1, wherein the cover includes a package passage opening formed through a center portion thereof to enable the semiconductor package to pass through.

9. The socket apparatus of claim 1, further comprising elastic support means disposed between the main body and the cover.

10. The socket apparatus of claim 9, wherein the elastic support means comprises:
    a plurality of guide pins each having a threaded portion at a lower end and inserted into a guide hole formed at a corner of the cover and into a spring guide hole formed at a corner of the main body;
    a plurality of elastic support springs each disposed between the cover and the main body and receiving one of the plurality of guide pins therethrough; and
    a plurality of fixing nuts each screwed onto the threaded portion of one of the plurality of guide pins.

11. A socket apparatus for testing a semiconductor package having a plurality of terminals, comprising:
    a main body having a plurality of contact pins for contacting electrically the plurality of terminals of the semiconductor package;
    a locking unit disposed in the main body for assuring a close contact between the plurality of terminals of the semiconductor package with the plurality of contact pins of the main body;
    a releasing unit for disengaging the locking unit and releasing the semiconductor package from the main body;
    a cover disposed above the main body for operating the locking unit and the releasing unit; and
    wherein the locking unit includes a pair of support rollers capable of pressing the semiconductor package against the main body, thus securing the semiconductor package within the main body.

12. The socket apparatus of claim 11, wherein the locking unit further comprises:
    a pair of sliders disposed at an inner surface of the main body, the pair of sliders facing against each other;
    a pair of compression springs disposed between the inner surface of the main body and each of the pair of sliders for elastically supporting the pair of sliders against the inner surface of the main body; and
    wherein each of the pair of support rollers is rotatably disposed at a front portion of each of the pair of sliders, respectively.

13. The socket apparatus of claim 12, wherein the locking unit further comprises a pair of sliding plates extended from an end portion of each slider for engaging with a recess formed on the inner surface of the main body.

14. The socket apparatus of claim 12, wherein the releasing unit comprises:
    a first pair of cam rollers rotatably engaged with a first slider of the pair of sliders;
    a second pair of cam rollers rotatably engaged with a second slider of the pair of sliders; and
    a pair of cam plates extending from a lower surface of the cover, capable of being inserted between the first and second pairs of cam rollers.

15. The socket apparatus of claim 14, wherein the pair of cam plates each have slopes upwardly slanted from a bottom portion thereof.

16. The socket apparatus of claim 11, further comprising elastic support members disposed between the main body and the cover for elastically supporting the cover.

* * * * *

UNITED STATES PATENT AND TRADEMARK OFFICE
CERTIFICATE OF CORRECTION

PATENT NO. : 5,989,039
DATED : Nov. 23, 1999
INVENTOR(S) : Yu Sik LIM

It is certified that error appears in the above-identified patent and that said Letters Patent is hereby corrected as shown below:

On the Title Page:
The patent is corrected to read as follows:

Item [54] TITLE:

--SOCKET APPARATUS FOR TESTING SEMICONDUCTOR PACKAGE--

Item [75] INVENTOR:

--Yu Sik LIM--

Signed and Sealed this

Twenty-seventh Day of March, 2001

Attest:

NICHOLAS P. GODICI

Attesting Officer     Acting Director of the United States Patent and Trademark Office